(12) United States Patent
Huo et al.

(10) Patent No.: US 8,927,963 B2
(45) Date of Patent: Jan. 6, 2015

(54) SEMICONDUCTOR MEMORY CELL, DEVICE, AND METHOD FOR MANUFACTURING THE SAME

(75) Inventors: Zongliang Huo, Beijing (CN); Ming Liu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 13/512,643

(22) PCT Filed: Jun. 30, 2011

(86) PCT No.: PCT/CN2011/076683
§ 371 (c)(1),
(2), (4) Date: May 30, 2012

(87) PCT Pub. No.: WO2012/062125
PCT Pub. Date: May 18, 2012

(65) Prior Publication Data
US 2012/0248503 A1    Oct. 4, 2012

(30) Foreign Application Priority Data

Nov. 10, 2010   (CN) .......................... 2010 1 0541159

(51) Int. Cl.
H01L 29/06    (2006.01)
H01L 31/00    (2006.01)
H01L 29/78    (2006.01)

(52) U.S. Cl.
CPC ......... *H01L 29/7841* (2013.01); *Y10S 438/933* (2013.01); *Y10S 438/938* (2013.01)
USPC .............. 257/19; 257/E21.182; 257/E21.207; 438/933; 438/938

(58) Field of Classification Search
USPC .......................................................... 257/19
See application file for complete search history.

(56) References Cited

U.S. PATENT DOCUMENTS 7,067,855 B2 * 6/2006 Cardone et al. ............... 257/190
7,193,279 B2 * 3/2007 Doyle et al. ................... 257/401
(Continued)

FOREIGN PATENT DOCUMENTS

CN    1476080 A    2/2004
JP    2006108488 A    4/2006

OTHER PUBLICATIONS

Michael Quirk and Julian Serda, Semiconductor Manufacturing Technology, 2001, Pearson Education International, pp. 21-42, 199-296, & 571-600.*

(Continued)

*Primary Examiner* — Matthew W Such
*Assistant Examiner* — Samuel Lair
(74) *Attorney, Agent, or Firm* — Westman, Champlin & Koehler, P.A.

(57) ABSTRACT

A semiconductor memory cell, a semiconductor memory device, and a method for manufacturing the same are disclosed. The semiconductor memory cell may comprise: a substrate; a channel region on the substrate; a gate region above the channel region; a source region and a drain region on the substrate and at opposite sides of the channel region; and a buried layer, which is disposed between the substrate and the channel region and comprises a material having a forbidden band narrower than that of a material for the channel region material. The buried layer material has a forbidden band narrower than that of the channel region material, so that a hole barrier is formed in the buried layer. Due to the barrier, it is difficult for holes stored in the buried layer to leak out, resulting in an improved information holding duration of the memory cell utilizing the floating-body effect.

20 Claims, 6 Drawing Sheets

(56) References Cited

U.S. PATENT DOCUMENTS

| | | | |
|---|---|---|---|
| 7,202,503 B2* | 4/2007 | Chow et al. ..................... 257/78 |
| 7,262,428 B2* | 8/2007 | Forbes ............................ 257/19 |
| 7,525,161 B2* | 4/2009 | Ieong et al. .................. 257/369 |
| 7,868,318 B2* | 1/2011 | Hudait et al. .................. 257/19 |
| 8,283,653 B2* | 10/2012 | Pillarisetty et al. ............. 257/20 |
| 2005/0242340 A1* | 11/2005 | Chidambarrao et al. ....... 257/19 |
| 2005/0263763 A1* | 12/2005 | Bhattacharyya ................ 257/66 |
| 2006/0157688 A1* | 7/2006 | Bhattacharyya ................ 257/19 |
| 2007/0001165 A1* | 1/2007 | Ranica et al. ................... 257/19 |
| 2007/0007509 A1* | 1/2007 | Shaheen ......................... 257/19 |
| 2007/0023745 A1* | 2/2007 | Jung ............................... 257/19 |
| 2008/0078987 A1* | 4/2008 | Leusink .......................... 257/19 |
| 2012/0061649 A1* | 3/2012 | Datta et al. ..................... 257/24 |

OTHER PUBLICATIONS

Michael Quirk and Julian Serda, Semiconductor Manufacturing Technology, 2001, Pearson Education International, pp. 21-42, 199-296, & 571-600, ISBN 0-13-081520-9.*

PCT Search Report and Written Opinion for PCT Application No. PCT/CN2011/076683, dated Oct. 13, 2011, 8 pages.

* cited by examiner

US 8,927,963 B2

SEMICONDUCTOR MEMORY CELL, DEVICE, AND METHOD FOR MANUFACTURING THE SAME

CROSS-REFERENCE TO RELATED APPLICATION

This application is National Phase application of, and claims priority to, PCT/CN2011/076683, filed on Jun. 30, 2011, entitled "SEMICONDUCTOR MEMORY CELL, DEVICE, AND METHOD FOR MANUFACTURING THE SAME", which claims priority to the Chinese Patent Application No. 201010541159.6, filed on Nov. 10, 2010, both the PCT Application and Chinese Application are incorporated herein by reference in their entireties.

TECHNICAL FIELD

The present disclosure relates to the technical field of microelectronics. In particular, the present disclosure relates to a semiconductor memory cell, a semiconductor memory device, and a method for manufacturing the same.

BACKGROUND

Microelectronics products are generally classified into two categories: logic devices and memory devices. As an important type of memory devices, Dynamic Random Access Memories (DRAMs) can support high-speed reading/writing of data. However, stored data will easily get lost in case of power-off. Therefore, the DRAMs are called volatile semiconductor memories. In a computer system, the DRAM has a data processing speed lower than that of a high-speed microprocessor and higher than that of a low-speed non-volatile memory, and thus achieves matching between high-speed data processing and low-speed data accessing. With continuous development of the information technology, high-speed and high-density DRAMs become an important trend of the current memory researches.

A conventional DRAM cell comprises an access transistor and a capacitor (1T1C). The capacitor is configured to store data, and the transistor is configured to control reading/writing of the data. With scaling-down of the memory cell, it has become difficult for the conventional 1T1C structure to satisfy requirements such as low leakage current of the transistor and large storage capability of the capacitor. Meanwhile, for either a trench-type capacitor or a stack-type capacitor, it is difficult to reduce the size thereof while ensuring a capacitance larger than 25 pF. Therefore, the current memory researches focus on seeking a new DRAM cell structure.

Currently, Floating-Body memory Cells (FBCs) are attracting attentions from the industry due to its complete compatibility with conventional processes and flexibility of switching. FIG. 1A is a schematic view showing an existing FBC implemented on an SOI substrate. FIG. 1B is a schematic view showing an existing FBC cell implemented on a bulk-silicon substrate. As shown in FIG. 1A and FIG. 1B, the memory cell comprises: an electrode formed as a back-gate electrode under a back-gate insulation layer (FIG. 1A) or an N-type heavily-doped region (FIG. 1B); a channel region on the substrate; a gate region above the channel region; and a source region and a drain region on the substrate and at opposite sides of the channel region.

FIG. 2 is a schematic view illustrating the data storage principle of an existing FBC cell. As shown in FIG. 2, when the device is being programmed, a high positive voltage $V_d$ is applied to the drain region, and an on-voltage $V_g$ of the transistor is applied to the gate, wherein $V_g = V_d/4 \sim V_d/2$. In such a case, electrons obtain high energy during its movement from the source region to the drain region, and thus cause impact ionization under a high electrical field near the drain region to generate electron-hole pairs. The holes move toward the substrate. Because silicon dioxide (in case of the SOI substrate) or N-type heavily doped bulk-silicon creates a barrier on the path of the holes moving toward the substrate, the holes accumulate near the substrate. The accumulation of the holes raises the potential of the substrate and therefore reduces the threshold voltage of the transistor. This state is referred to as a write state ("1" state). If a negative voltage is applied to the source region or the drain region, the holes stored near the substrate will be removed, raising the threshold voltage of the transistor. This state is referred to as an erase state ("0" state). A combination of the "0" state and the "1" state will achieve a high-speed erasing/writing operation. Unlike the conventional 1T1C structure, the FBC cell structure avoids process complexity due to the complex capacitor structure, and meanwhile can achieve high-density integration of the memory cells.

Though the FBC cell structure has many advantages in terms of process complexity and high-density integration, it still faces some challenges in connection with data holding duration. The existing technology has a disadvantage that if the FBC cell is not in a programmed state, the holes stored near the substrate tend to leak through a PN junction between the source region and the substrate, or a PN junction between the drain region and the substrate. As a result, the data holding duration of the FBC cell is short, which may be less than 1 second. Accordingly, the memory device has an increased number of refreshing operations and also increased power consumption.

SUMMARY

Problems to be Solved

In order to solve the problem of the existing technology that if the FBC cell is not in a programmed state, the holes stored near the substrate tend to leak through the PN junction between the source region and the substrate or the PN junction between the drain region and the substrate, resulting in a short data holding duration of the FBC cell, there is provided a semiconductor memory cell, a semiconductor memory device, and a method for manufacturing the same.

Technical Solutions

In a semiconductor memory device, the hole holding duration mainly depends on a depth of a hole barrier created at hole holding locations and an amplitude of a leakage current through a source/drain PN junction. According to an embodiment of the present disclosure, a high hole barrier can be created by using a substrate material with a narrow forbidden band. In addition, according to a further embodiment the present disclosure, an insulation layer can be formed under the source/drain junction to reduce the PN junction area.

Preferably, in the semiconductor memory cell according to the present disclosure, a channel region may comprise Si or stressed Si, and a buried layer may comprise an IV group material or an III-V group material. Alternatively, the channel region may comprise $Si_xGe_{1-x}$ where $0<x<=1$, and the buried layer may comprise Ge.

Preferably, in the semiconductor memory cell according to the present disclosure, the IV group material may comprise any one of $Si_xGe_{1-x}$ where 0<x<1, Ge, and graphene. The III-V group material may comprise any one of GaN, InP, GaAs, and InGaAs.

Preferably, the semiconductor memory cell according to the present disclosure may further comprise an insulation layer between a source/drain region and the substrate and at opposite sides of the buried layer. Preferably, the insulation layer extends partially between the channel region and the substrate.

Preferably, in the semiconductor memory cell according to the present disclosure, the insulation layer may comprise any one of $GeO_x$ where 0<x<=2, $SiO_2$, SiC, $HfO_2$, $Al_2O_3$, and $Si_xN_y$.

Preferably, in the semiconductor memory cell according to the present disclosure, the substrate may comprise an SOI substrate or a bulk-silicon substrate. A gate region may comprise a gate dielectric layer formed on the channel region and a gate electrode formed on the gate electrode layer.

Preferably, in the semiconductor memory cell according to the present disclosure, the gate dielectric layer may comprise any one or more of $SiO_2$, $SiO_xN_y$ (0<x<2, 0<y<2), HfSiON, $HfO_2$, and $Al_2O_3$, and the gate electrode may comprise any one or more of polysilicon, metal, metal silicide, and metal nitride.

According to another aspect of the present disclosure, there is provided a semiconductor memory device, comprising a plurality of the foregoing semiconductor memory cells.

According to a still further aspect of the present disclosure, there is provided a method for manufacturing a semiconductor memory device. The method may comprise: depositing a buried layer on a substrate, wherein the buried layer comprises a material having a forbidden band narrower than that of a material for the channel region; epitaxially growing or depositing a channel layer on the buried to layer; depositing a photoresist layer and forming a mask layer for gate etching by exposure and development; forming a channel region by etching with the mask layer for gate etching, and forming memory cell isolation by filling back silicon dioxide; and forming a gate region, a source region, and a drain region, and forming peripheral wiring connections to the gate/source/drain.

Beneficial Effects

The memory cell and memory device according to the present disclosure have the following beneficial effects, for example.

(1) According to the present disclosure, when the memory cell is programmed, holes will be stored in the buried layer having a narrow forbidden band and thus giving a large valence band offset. The barrier between the channel layer and the buried layer can effectively reduce the moving speed of the holes toward the source/drain end, and therefore increase the data holding duration, (2) According to the present disclosure, an insulation layer can be formed right under the source/drain region, effectively reducing the contact area of the PN junction and suppressing the leakage current through the PN junction. As a result, the data holding performance can be further improved, and thus a number of refreshing operations and power consumption of the device can be reduced.

(3) The process for manufacturing the structure according to the present disclosure is completely compatible with the conventional logic processes and is advantageous in high-density three-dimensional integration.

DETAILED DESCRIPTION OF EMBODIMENTS

The present disclosure will be further explained in detail in connection with specific embodiments and with reference to the drawings, so that objects, technical solutions and beneficial effects thereof will become more apparent.

Figure 1A:
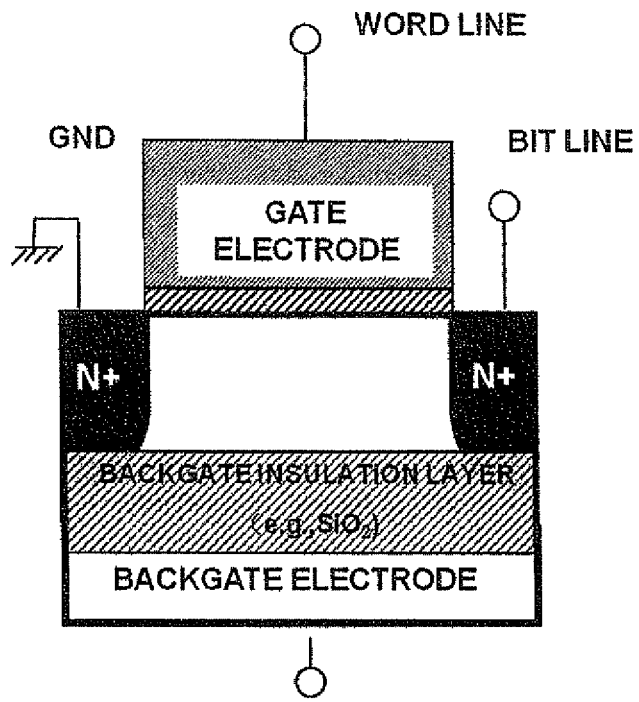
FIG. 1A is a schematic view showing an existing FBC cell implemented on an SOI substrate.
Figure 1B:
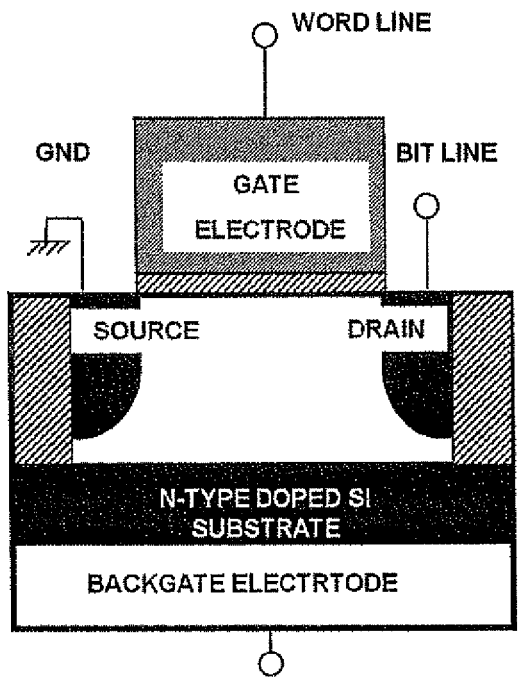
FIG. 1B is a schematic view showing an existing FBC cell implemented on a bulk-silicon substrate.
Figure 2:
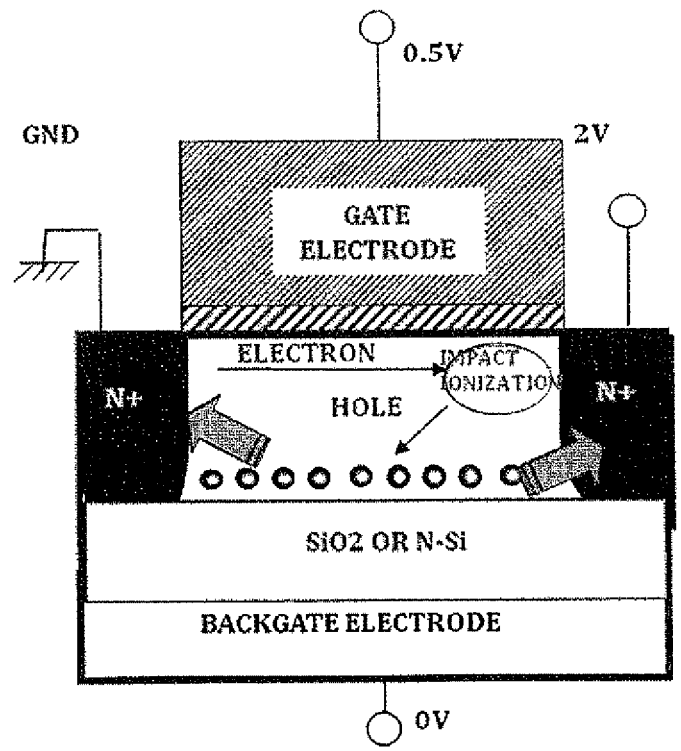
FIG. 2 is a schematic view illustrating the data storage principle of an existing FBC cell.
Figure 3:
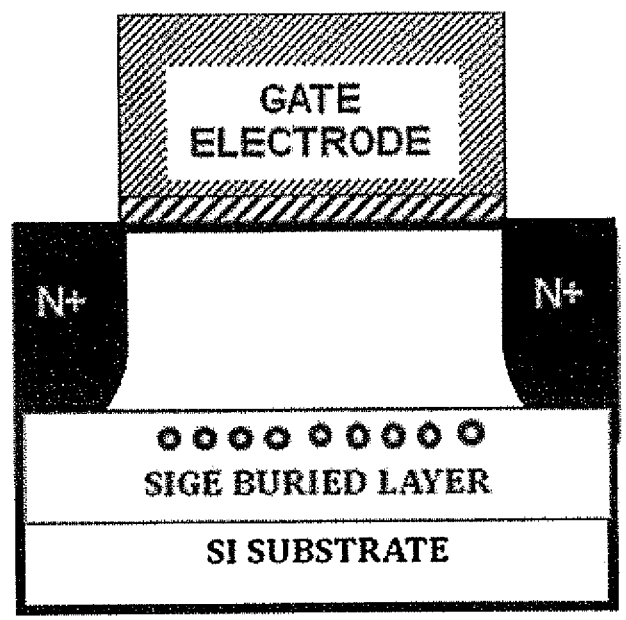
FIG. 3 is a schematic view showing a semiconductor memory cell according to an embodiment of the present disclosure.

FIG. 3 is a schematic view showing a semiconductor memory cell according to an embodiment of the present disclosure. As shown in FIG. 3, the semiconductor memory cell comprises: a substrate; a channel region on the substrate; a gate region above the channel region; a source region and a drain region on the substrate and at opposite sides of the channel region; and a buried layer, which is disposed between the substrate and the channel region and comprises a material having a forbidden band narrower than that of a material for the channel region. The substrate may or may not have a back electrode formed thereon.

According to an embodiment, the channel region may comprise Si or stressed Si, and the buried layer may comprise an IV group material or an III-V group material, e.g., any one of $Si_xGe_{1-x}$, where 0<x<=1, Ge, graphene, GaN, GaAs, InGaAs, and InP. Alternatively, the channel region may comprise $Si_xGe_{1-x}$, where 0<x<=1, and the buried layer may comprise Ge.

According to the embodiment, the buried layer has a forbidden band narrower than that of the channel region, and thus there is a large valance band offset between the channel region and the buried layer. As a result, a hole barrier is formed in the buried layer and thus it is difficult for holes stored in the buried layer to leak out. In this way, information holding duration of the memory cell can be improved.

Figure 4:
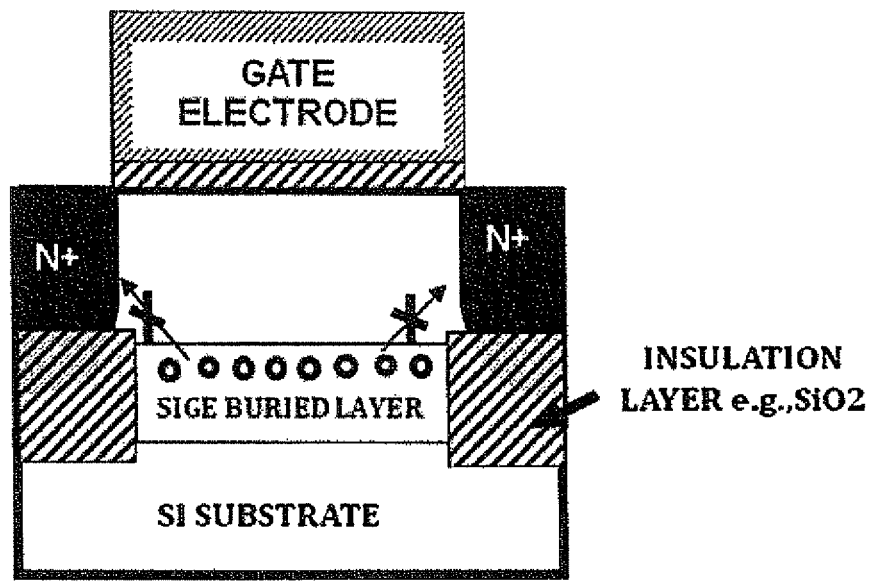
FIG. 4 is a schematic view showing a semiconductor memory cell according to an further embodiment of the present disclosure.

According to a further embodiment, further optimization can be made. FIG. 4 is a schematic view showing a semiconductor memory cell according to an embodiment of the present disclosure. In the semiconductor memory cell shown in FIG. 4, there is an insulation layer between the source/drain region and the substrate and at opposite sides of the buried layer. Preferably, the insulation layer may extend partially between the channel region and the substrate. That is, the insulation layer may have a lateral width larger than that of the source/drain region. The insulation layer may extend from the source/drain region into somewhere between the channel region and the substrate. The insulation layer may comprise any one of $GeO_x$ where 0<x<=2, $SiO_2$, SiC, and $Si_3N_4$.

Figure 5:
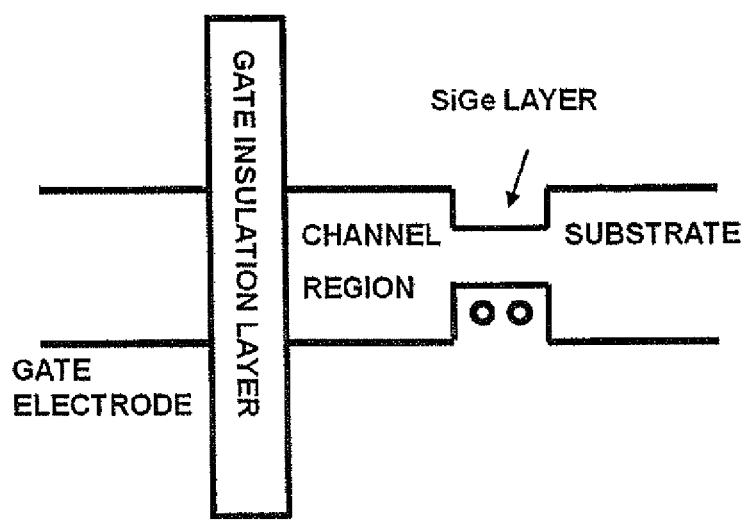
FIG. 5 is an energy-band diagram in a direction perpendicular to a channel of the semiconductor memory cell shown in FIG. 4.

FIG. 5 is an energy-band diagram in a section taken along a direction perpendicular to the channel of the semiconductor memory cell shown in FIG. 4. As shown in FIG. 5, the SiGe buried layer significantly enhances the hole barrier.

Figure 6:
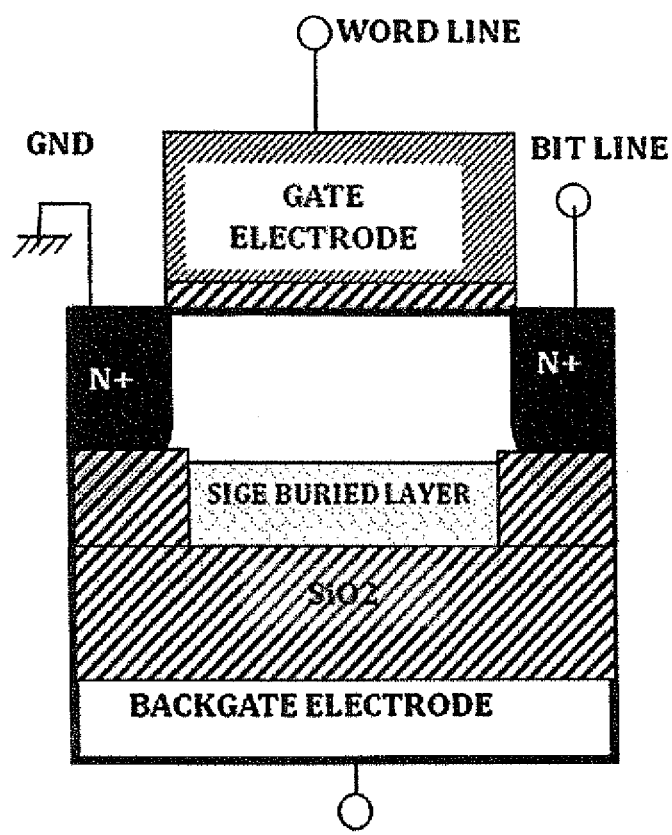
FIG. 6 is a schematic view showing a semiconductor memory cell on an SOI substrate according to an embodiment of the present disclosure.

The semiconductor memory cell shown in FIG. 4 uses the bulk-silicon substrate. Alternatively, according to a further embodiment an SOI substrate is also applicable, as shown in FIG. 6. Those arrangements shown in the embodiments are applicable to planar devices, or non-planar devices, such as FinFETs and 3D structures, etc.

According to an embodiment, the gate dielectric may comprise a conventional material such as $SiO_2$ and $SiO_xN_y$ ($1<x$, $y<2$), or a high-K material such as HfSiON, $HfO_2$, and $Al_2O_3$, etc. The gate dielectric may also comprise a mixture of the foregoing materials such as $SiO_2$/HfSiON, etc. The gate electrode may comprise a conventional material such as polysilicon, metal, metal silicide, and metal nitride, or a multilayer structure consisted of the foregoing materials.

In the semiconductor memory cell according to the embodiment, the insulation layer disposed right under the source/drain junction can effectively reduce a contact area of the PN junction and thus suppress leakage current through the PN junction. In this way, the data holding performance can be improved, a number of refreshing operations on the memory device can be reduced, and power consumption of the memory device can be reduced.

The present disclosure further provides a semiconductor memory device comprising one or more semiconductor memory cells, such as those according to the above described embodiments. Likewise, same or similar effects can be achieved.

Figure 7:
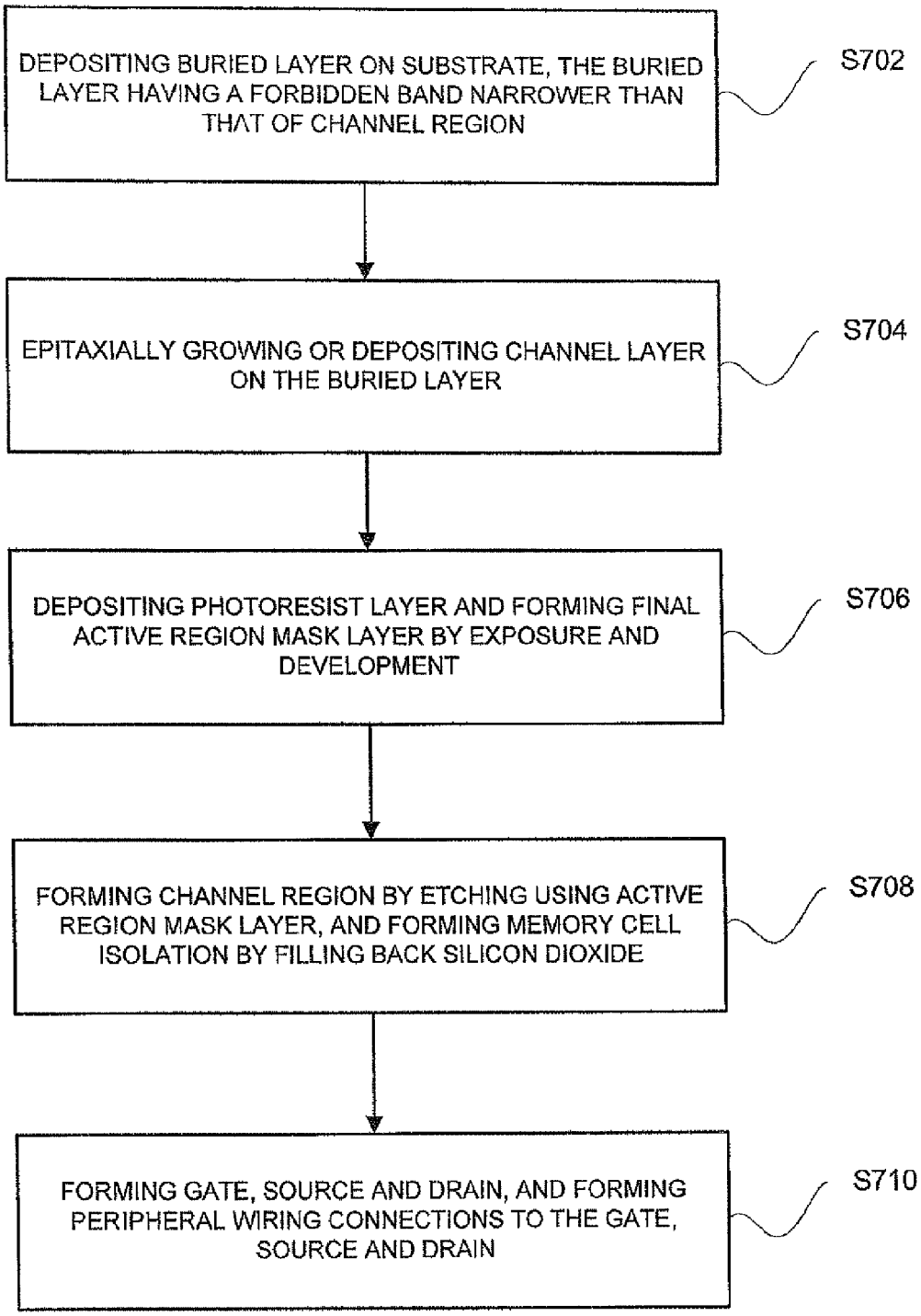
FIG. 7 is a flow diagram showing a method for manufacturing a semiconductor memory device according to an embodiment of the present disclosure.

FIG. 7 is a flow diagram showing a method for manufacturing a semiconductor memory device according to an embodiment of the present disclosure. As shown in FIG. 7, the method may comprise:
  in step S702, depositing a buried layer on a substrate, the buried layer comprising a material having a forbidden band narrower than that of a material for a channel region;
  in step S704, epitaxially growing or depositing a channel layer on the deposited buried layer;
  in step S706, depositing a photoresist layer on the deposited channel layer and obtaining a mask layer for an active region by exposure and development;
  in step S708, forming an active region by etching with the mask layer, and forming memory cell isolation by filling back silicon dioxide; and
  in step S710, forming a gate region, a source region, and a drain region on the active region, and forming peripheral wiring connections to the gate/source/drain.

As for specific positions of the buried layer, the channel region, the gate region, the source region, and the drain region of the memory cell, reference may be made to the foregoing embodiments, and detailed descriptions thereof are omitted. In the present embodiment, the buried layer is deposited between the substrate and the channel region to form a barrier between the buried layer and the channel and between the buried layer and the substrate. The barrier can effectively reduce a moving speed of the holes toward the source/drain end and therefore improve the data holding duration.

Figure 8:
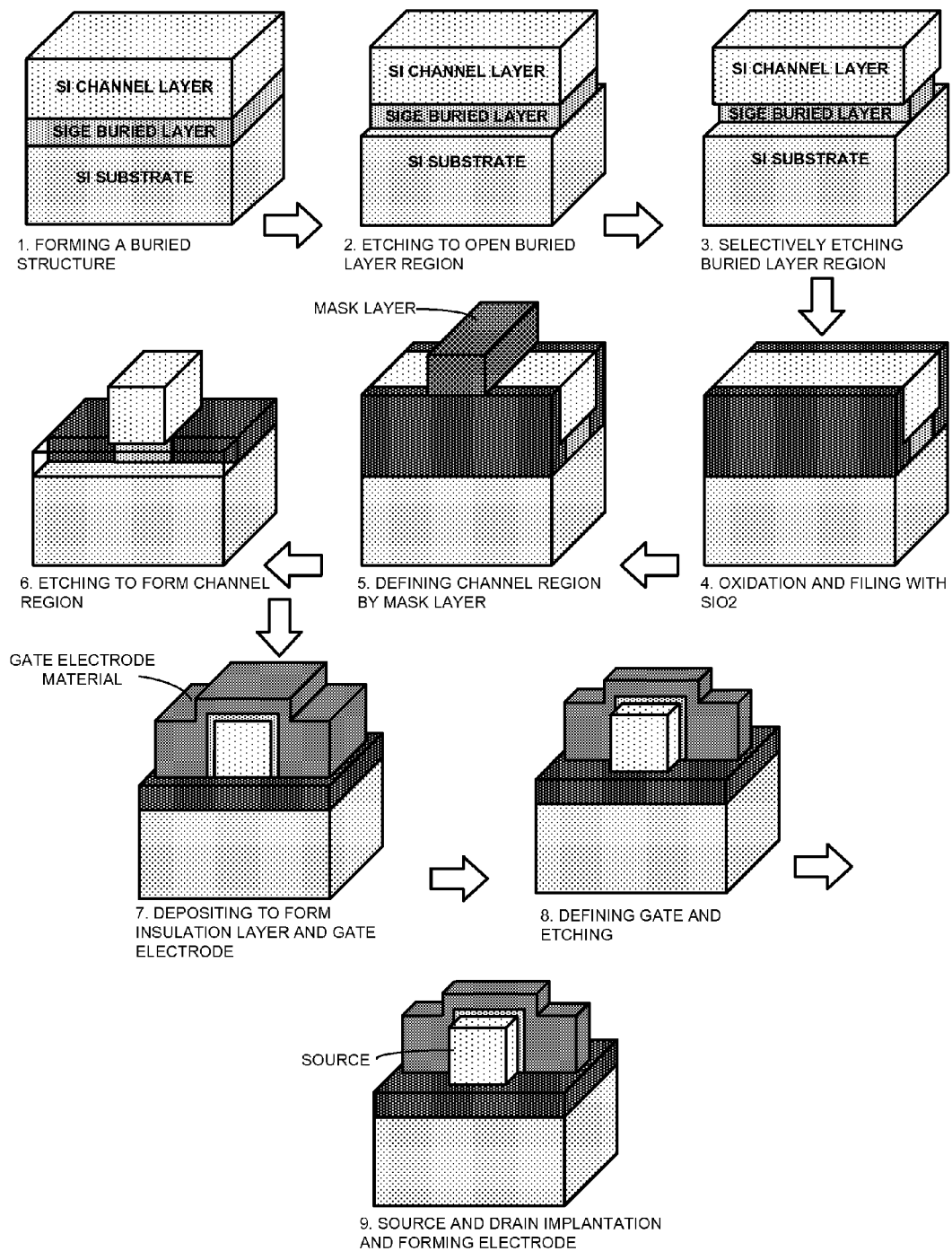
FIG. 8 is a process flow diagram showing implementation of a memory cell in a body-tied FinFET, by way of example, according to an embodiment of the present disclosure.

FIG. 8 is a process flow diagram showing implementation of a memory cell in a body-tied FinFET, by way of example, according to an embodiment of the present disclosure. The process may comprise:
  1) forming a $Si_xGe_{1-x}$ buried layer having a narrow forbidden band on a silicon substrate by epitaxial growing or depositing, and epitaxially growing or depositing a silicon channel layer on the buried layer;
  2) etching the SiGe buried layer/silicon channel layer by dry etching and exposing the buried layer;
  3) partially etching the SiGe layer by wet etching utilizing a high etching selectivity between materials for the channel region and the buried layer;
  4) forming isolation regions between memory cells by oxidation or depositing silicon oxide at etched positions;
  5) defining a mask layer for an active region with an active region mask;
  6) etching the channel region material and the buried layer material at positions uncovered by the mask layer to form a silicon channel, and forming cell isolation by filling back silicon dioxide;
  7) depositing a gate dielectric material and a gate electrode material by any one of thermal oxidation, ALD, LPCVD, and sputtering;
  8) forming a gate electrode and a gate dielectric layer by etching with a gate mask; and
  9) forming a source region and a drain region by source/drain implantation, optionally with a metal silicide, and completing the memory cell by forming peripheral wiring connections to the gate/source/drain electrode.

In the semiconductor memory cell, the device, and the method for manufacturing the same according to the present disclosure, the involved depositing process may comprise any one of electron beam deposition, magnetron sputtering, sol-gel deposition, and chemical vapor deposition, etc. The involved etching process may comprise wet etching or plasma dry etching, etc. Those skilled in the art may select proper depositing, etching or other processes according to practical conditions and environment factors. Any solution that can achieve the object and structure of the present disclosure falls in the scope of the present disclosure.

As described above, according to the present disclosure, a hole storage layer is formed by a material having a narrow forbidden band and thus giving a large valence band offset, such as $Si_xGe_{1-x}$. Incorporation of an insulation layer right under the source/drain junction can reduce the contact area of the PN junction. In this way, the leakage current through the PN junction can be effectively suppressed. As a result, the data holding performance can be improved, and thus the number of refreshing operations and power consumption of the DRAM memory device can be reduced. Meanwhile, the capacitor-free structure according to the present disclosure can completely avoid the process complexity due to the capacitor-structure in the conventional 1T1C structure. The process of this new structure is completely compatible with the conventional logic processes, and is advantageous in high-density three-dimensional integration.

The objects, technical solutions and beneficial effects of the present disclosure have been further explained in detail in connection with the above specific embodiments. It should be understood that all of the above are only specific embodiments of the present disclosure but do not constitute a restriction to the present disclosure. Any modification, equivalent substitution, and improvement, etc., within the spirit and principle of the present disclosure should be included in the scope of the present disclosure.

What is claimed is:
1. A semiconductor memory cell, comprising:
  a buried layer and a channel layer stacked on a substrate in a stacking direction substantially vertical to a surface of the substrate, wherein the buried layer is configured to store charges during operation of the memory cell, and has its opposite ends in a lateral direction substantially perpendicular to the stacking direction recessed with respect to the channel layer;

a gate region above the channel layer;

a source region and a drain region formed in the channel layer, wherein the gate region is configured to induce a channel region between the source region and the drain region in the channel layer; and an insulation layer provided between the source and drain regions and the substrate and adjacent to the opposite ends of the buried layer;

wherein the buried layer comprises a material having a forbidden band narrower than that of a material for the channel layer, and is configured to suppress leakage of the charges stored therein into the source and drain regions.

2. The semiconductor memory cell according to claim 1, wherein:
the channel layer comprises Si or stressed Si, and the buried layer comprises an IV group material or an III-V group material; or alternatively
the channel layer comprises $Si_xGe_{1-x}$, where $0<x<=1$, and the buried layer comprises Ge.

3. The semiconductor memory cell according to claim 2, wherein
the IV group material comprises any one of $Si_xGe_{1-x}$ where $0<x<1$, graphene, and Ge; and
the III-V group material comprises any one of GaN, InP, GaAs, and InGaAs.

4. The semiconductor memory cell according to claim 1, wherein the insulation layer extends partially between the channel region and the substrate.

5. The semiconductor memory cell according to claim 1, wherein the insulation layer comprises any one of $GeO_x$ where $0<x<=2$, $SiO_2$, SiC, $HfO_2$, $Al_2O_3$, and $Si_3N_4$.

6. The semiconductor memory cell according to claim 1, wherein the substrate comprises an SOI substrate or a bulk-silicon substrate.

7. The semiconductor memory cell according to claim 1, wherein the gate region comprises a gate dielectric layer formed on the channel layer and a gate electrode formed on the gate electrode layer.

8. The semiconductor memory cell according to claim 7, wherein
the gate dielectric layer comprises any one or more of $SiO_2$, $SiO_xN_y$, where $0<x<2$ and $0<y<2$, HfSiON, $HfO_2$, and $Al_2O_3$, and
the gate electrode comprises any one or more of polysilicon, metal, silicide, and nitride.

9. A semiconductor memory device, comprising a plurality of the semiconductor memory cells according to claim 1.

10. The semiconductor memory cell according to claim 1, wherein the insulation layer is contiguous with the buried layer in the lateral direction.

11. The semiconductor memory cell according to claim 10, wherein the insulation layer is located at substantially the same level as the buried layer in the stacking direction.

12. The semiconductor memory cell according to claim 1, wherein the source and drain regions are located directly on the insulation layer.

13. The semiconductor memory cell according to claim 12, wherein the source and drain regions have their bottoms delimited by the insulation layer.

14. A method for manufacturing a semiconductor memory cell, comprising:
stacking a buried layer and a channel layer sequentially on a substrate in a stacking direction substantially vertical to a surface of the substrate, wherein the buried layer is configured to store charges during operation of the memory cell;
etching the channel layer and the buried layer;
selectively etching a portion of the buried layer underneath the channel layer so that the buried layer has its opposite ends in a lateral direction substantially perpendicular to the stacking direction recessed with respect to the channel layer;
forming an insulation layer on the substrate at the opposite ends of the buried layer;
forming a gate region above the channel layer; and
forming a source region and a drain region in the channel layer;
wherein the buried layer comprises a material having a forbidden band narrower than that of a material for the channel layer, and is configured to suppress leakage of the charges stored therein into the source and drain regions.

15. The method according to claim 14, wherein:
the channel layer comprises Si or stressed Si, and the buried layer comprises an IV group material or an III-V group material; or alternatively
the channel layer comprises $Si_xGe_{1-x}$, where $0<x<=1$, and the buried layer comprises Ge.

16. The method according to claim 14, wherein the insulation layer comprises any one of $GeO_x$ where $0<x<=2$, $SiO_2$, SiC, and $Si_3N_4$.

17. The method according to claim 14, wherein the insulation layer is formed to be contiguous with the buried layer in the lateral direction.

18. The method according to claim 17, wherein the insulation layer is formed to be located at substantially the same level as the buried layer in the stacking direction.

19. The method according to claim 14, wherein the source and drain regions are formed so that they are located directly on the insulation layer.

20. The method according to claim 19, wherein the source and drain regions have their bottoms delimited by the insulation layer.

* * * * *